(12) United States Patent
Shi

(10) Patent No.: US 6,940,053 B2
(45) Date of Patent: Sep. 6, 2005

(54) CHIP BONDING HEATER WITH DIFFERENTIAL HEAT TRANSFER

(75) Inventor: Song-Hua Shi, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/716,945

(22) Filed: Nov. 18, 2003

(65) Prior Publication Data

US 2005/0103774 A1    May 19, 2005

(51) Int. Cl.$^7$ .............................................. H05B 3/10
(52) U.S. Cl. ...................... 219/548; 219/228; 219/229
(58) Field of Search ................................ 219/209, 243, 219/548, 201, 219, 227, 228, 229, 232; 29/593; 156/306.9; 438/108

(56) References Cited

U.S. PATENT DOCUMENTS

| | | | | |
|---|---|---|---|---|
| 3,289,046 A | * | 11/1966 | Carr | 361/772 |
| 3,547,604 A | * | 12/1970 | Davis, Jr. et al. | 29/593 |
| 5,951,893 A | * | 9/1999 | Bitko et al. | 219/209 |
| 6,614,003 B2 | * | 9/2003 | Hembree et al. | 219/209 |
| 6,770,164 B1 | * | 8/2004 | Schrock et al. | 156/306.9 |
| 2002/0060368 A1 | * | 5/2002 | Jiang | 257/778 |
| 2003/0194833 A1 | * | 10/2003 | Quinones et al. | 438/108 |

* cited by examiner

Primary Examiner—Robin O. Evans
Assistant Examiner—Leonid Fastovsky
(74) Attorney, Agent, or Firm—Micheal D. Plimier

(57) ABSTRACT

The invention provides a heater for flip chip bonding. The heater transfers more heat to the periphery of a die than to the center. This results in a more even temperature profile along the die and helps prevent epoxy voiding problems.

13 Claims, 6 Drawing Sheets

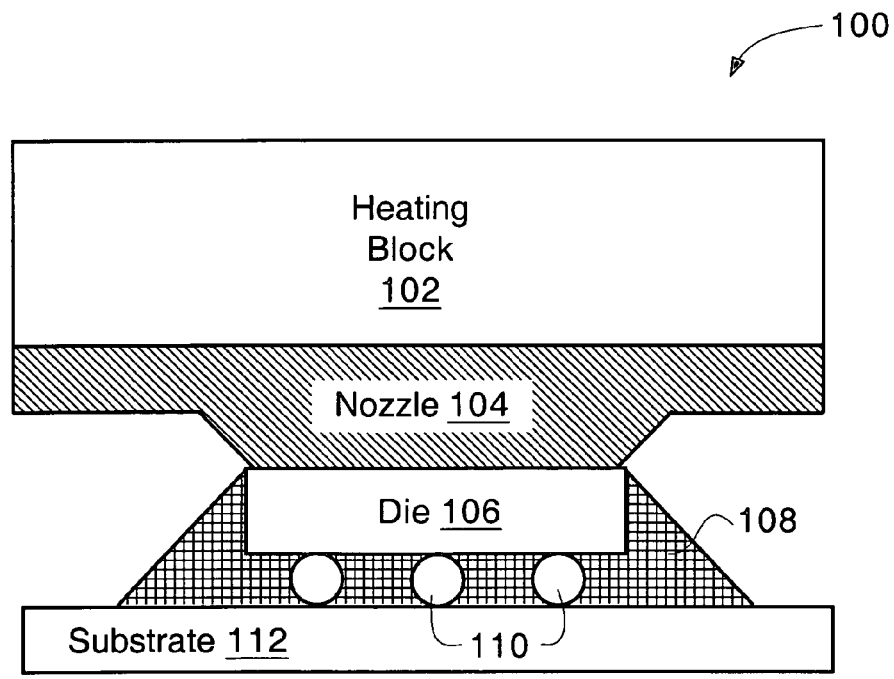
Figure 1a
(Prior Art)
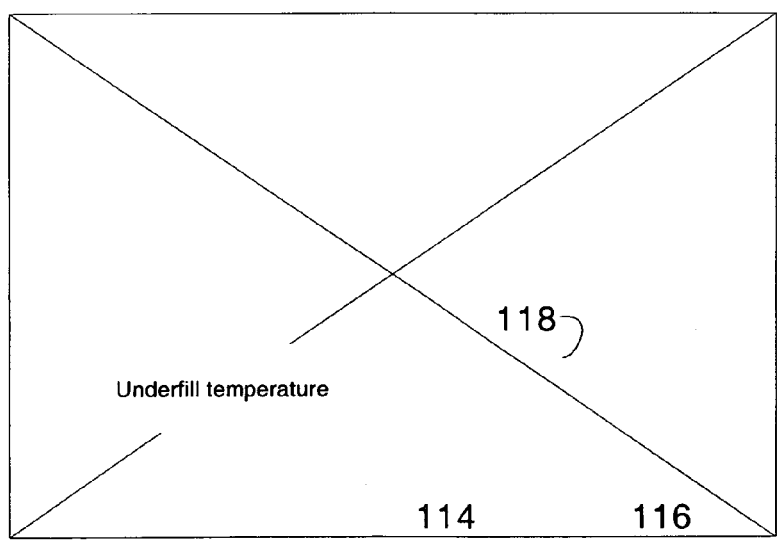
Figure 1b
(Prior Art)
Figure 1c
(Prior Art)
Figure 1d
(Prior Art)

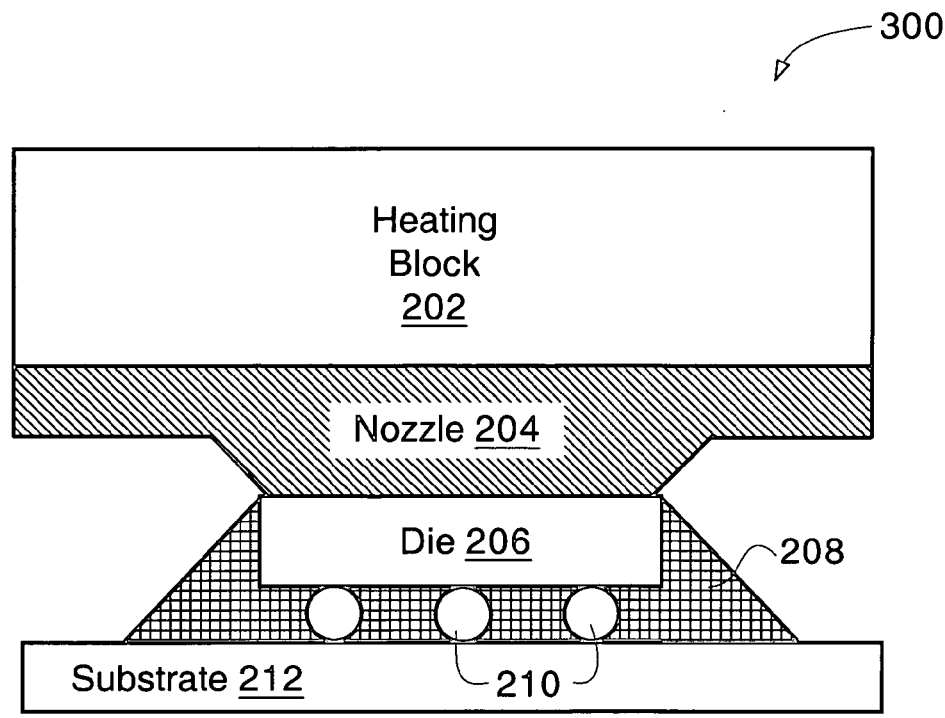
Figure 3a
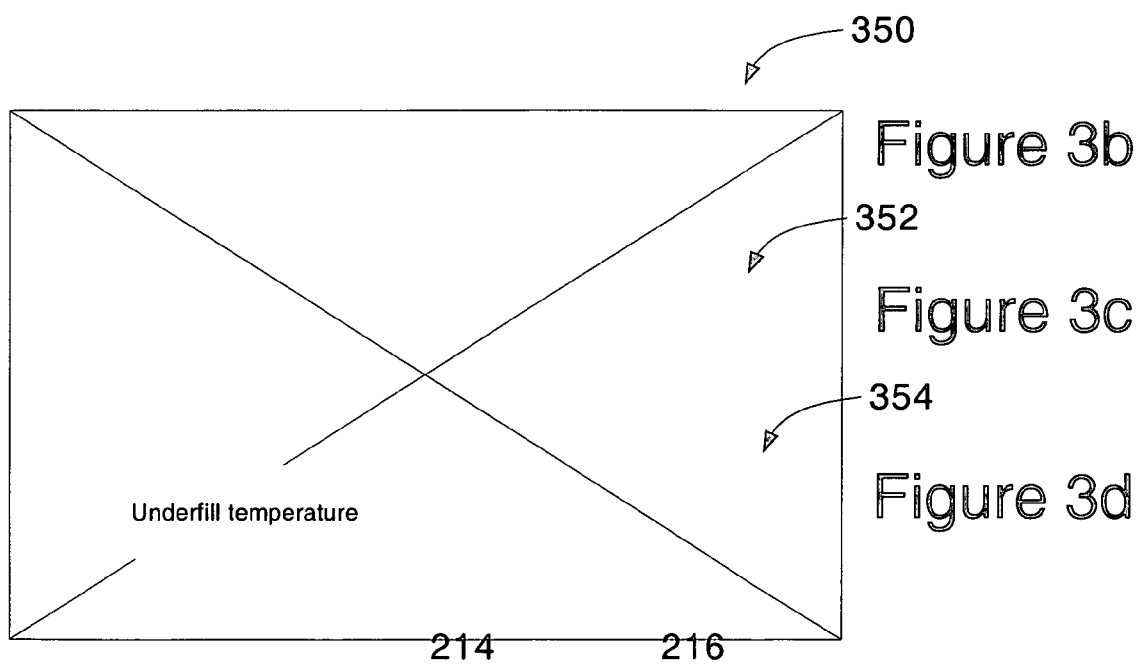
Figure 3b
Figure 3c
Figure 3d

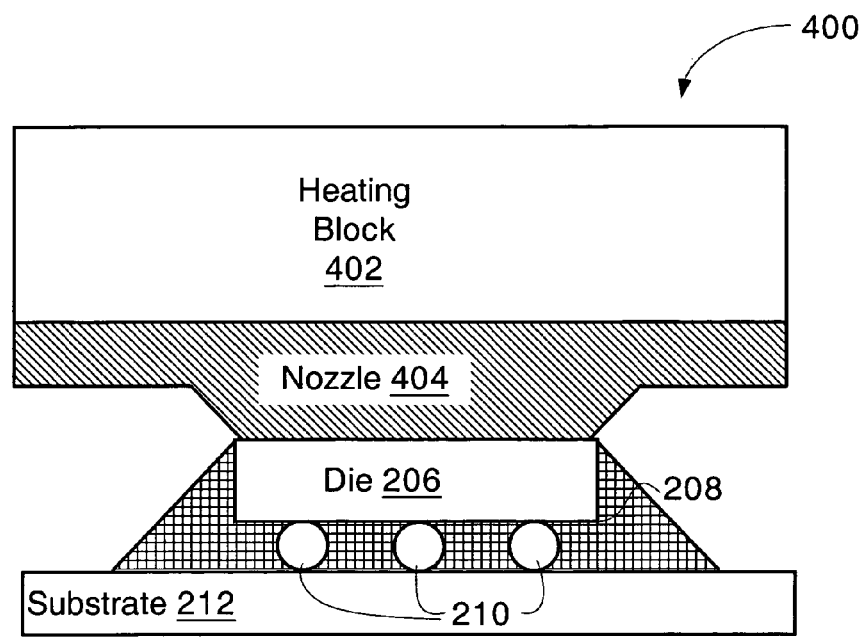
Figure 4a
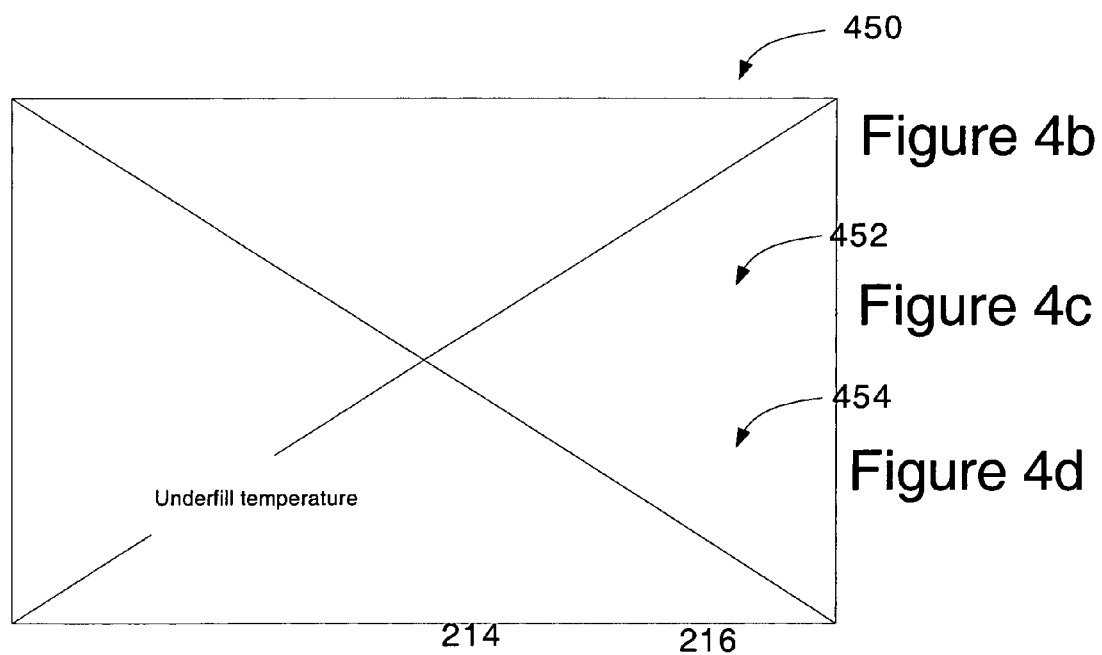
Figure 4b
Figure 4c
Figure 4d

CHIP BONDING HEATER WITH DIFFERENTIAL HEAT TRANSFER

BACKGROUND

Background of the Invention

FIG. 1a is a cross sectional side view of a heating assembly 100 to attach a die 106 to a substrate 112. A heating block 102 generates heat. A heat nozzle 104 transmits heat from the heating block 102 to a die 106. The die 106 is positioned above a substrate 112. Solder bumps 110, once melted by the heat applied to the die 106 and then cooled, attach the die 106 to the substrate 112. Underfill material 108, such as epoxy resin, substantially fills the areas between the die 106 and the substrate 112.

FIG. 1b is a graph that shows the heat generated by different areas of the heating block 102. The heating block 102 generates heat in a substantially uniform manner, as shown by the graph in FIG. 1b. Heat put out at one point of the heating block's 102 surface is about equal to heat put out at another point of the heating block's 102 surface. FIG. 1c is a graph that shows the thermal conductivity of the heat nozzle 104. As shown in the graph of FIG. 1c, the thermal conductivity of the heat nozzle 104 is substantially the same from the left edge 114 of the die to the right edge 116 of the die. FIG. 1d illustrates a graph that shows the temperature of the solder bump 110 and the underfill material 108 beneath the die 106 that results from the heat generated by the heating block 102 as shown by the graph in FIG. 1b and transmitted from the heating block 102 to the die 106 by the heat nozzle 104 as shown by the graph in FIG. 1c. The graph in FIG. 1d shows that the temperature at the die 106 is lower at the left 114 and right 116 edges of the die 106, and has a higher temperature peak 118 approximately in the center.

Since heat may be exchanged between the edges 114, 116 of the die 106 and the surrounding environment, some heat at the edges of the die is dispersed, leaving the center of the die 106 hotter. Applying enough heat to ensure that the temperature near the edges 114, 116 of the die 106 is hot enough to melt the solder bumps 110 to attach the die 106 to the substrate 112 may result in a higher peak 118 temperature near the center of the die 106 that may be too high and result in overheating the underfill material 108 and causing voids in the underfill 108 to occur.

BRIEF DESCRIPTION OF THE DRAWINGS

FIG. 1a is a cross sectional side view of a heating assembly.

FIG. 1b is a graph that shows the heat generated by different areas of the heating block.

FIG. 1c is a graph that shows the thermal conductivity of the heat nozzle.

FIG. 1d illustrates a graph that shows the temperature of the underfill material beneath the die.

FIG. 3a is a cross sectional side view of one embodiment of a heating assembly that may provide more heat to the edges of a die than to the center of a die.

FIG. 3b illustrates a graph that shows the heat generated by the heating block.

FIG. 3c illustrates a graph that shows the thermal conductivity of the heat nozzle.

FIG. 3d illustrates a graph that shows the temperature of the underfill material beneath the die.

FIG. 4a is a cross sectional side view of another embodiment of a heating assembly that may provide more heat to the edges of a die than to the center of a die.

FIG. 4b illustrates a graph that shows the heat generated by the heating block.

FIG. 4c illustrates a graph that shows the thermal conductivity of the heat nozzle.

FIG. 4d illustrates a graph that shows the temperature of the underfill material beneath the die.

DETAILED DESCRIPTION

Figure 2:
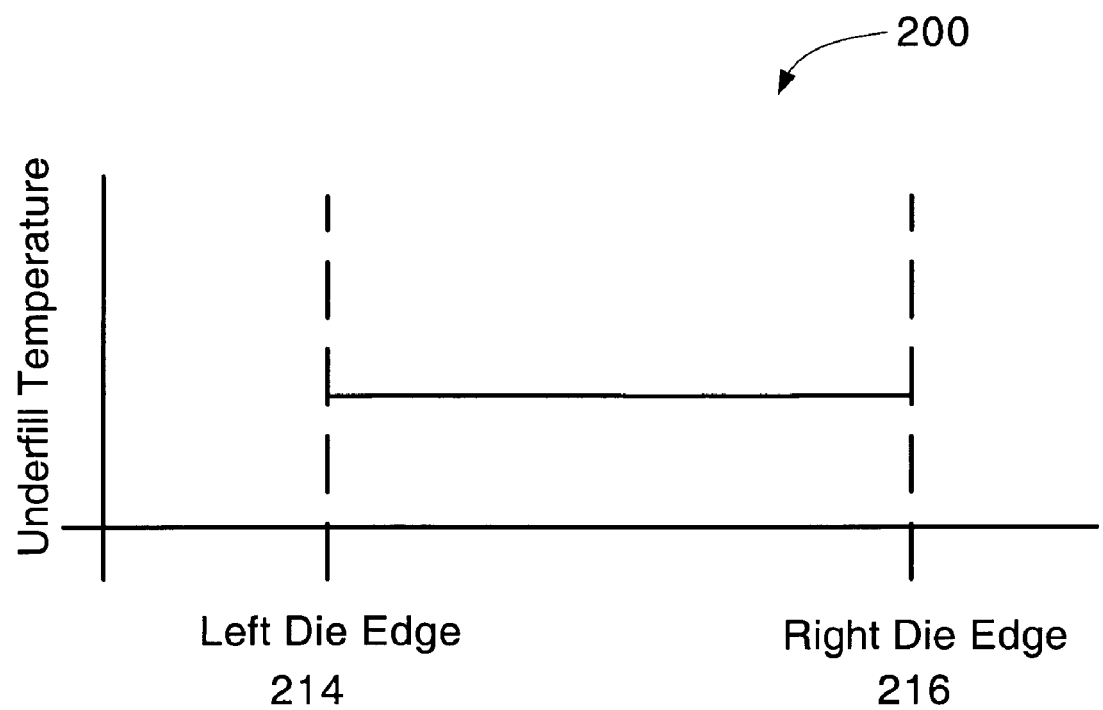
FIG. 2 illustrates a graph that shows the temperature of underfill material between a die and a substrate from a left die edge to a right die edge according to one embodiment of the present invention.

FIG. 2 illustrates a graph 200 that shows the temperature of solder bumps (or other connectors) and underfill material between a die and a substrate from a left die edge 214 to a right die edge 216 according to one embodiment of the present invention. According to an embodiment, the underfill temperature may be substantially the same from the left die edge 214 through the middle of the die to the right die edge 216. Since more heat is lost through the edges of a die than the center of the die, this temperature distribution may be achieved by applying more heat to the edges of the die than to the center of the die.

In some embodiments, the graph 200 may not be flat as that shown in FIG. 2, and the temperature may vary some at various points along the die, but the highest temperature may still remain below a temperature that would cause voids in underfill to occur. For example, in one embodiment, the underfill material may comprise an epoxy resin. The temperature of the underfill may be hotter in the middle of the die than at the edges 214, 216, but the temperature at the middle may remain lower than a temperature that would vaporize the underfill material to form voids. Various other embodiments may have a temperature that is cooler in the middle of the die than at the edges 214, 216, temperatures that are coolest at the edges 214, 216, hotter at a distance from the edges 214, 216, and cooler again in the middle of the die, or other temperature distributions.

FIG. 3a is a cross sectional side view of one embodiment of a heating assembly 300 that may provide more heat to the edges of a die than to the center of a die. The heating assembly 300 may include a heating block 202 and a heat nozzle 204. The heating block 202 may be anything that can generate heat and transfer it to the heat nozzle 204. In various embodiments, the heating block 202 may produce heat by passing through a conductive element that has resistance, by generating microwaves, through infrared radiation, or other methods. In an embodiment, the heating block 202 may be capable of heating itself, the heat nozzle 202, and a die 206 to a temperature in a range from about 200 degrees Celsius to about 340 degrees Celsius at a rate in a range from about 10 degrees Celsius per second to about 50 degrees Celsius per second or higher. The heat nozzle 204 may receive heat generated by the heating block 202 and transmit that heat to a die 206. In an embodiment, the heating block 202 and heat nozzle 204 may be two components that are coupled so that the heat nozzle 204 may receive the heat generated by the heating block 202 and transmit that heat to the die 206. In another embodiment, the heating block 202 and heat nozzle 204 may comprise a single component. For example, the heating block 202 may be the part of the component that generates heat, and the heat nozzle 204 may be an area of the component adapted to transmit the heat to the die 206. Together, the heating block 202 and the heat nozzle may be considered to comprise a heater.

The die 206 may be an integrated circuit die such as a microprocessor. The die 206 may be positioned above a substrate 212. Connectors, such as solder bumps 210 or other connectors, may be between the die 206 and the substrate 212. The heater may operate to apply heat to the die 206. This heat may melt the solder bumps 210. When cooled, the solder bumps 210 may couple the die 206 to the substrate 212. Underfill material 208 may substantially fill the areas between the die 206 and the substrate 212. In an embodiment, the underfill material 208 may comprise an epoxy material.

In the embodiment illustrated in FIG. 3a, the heating block 202 may generate heat unevenly. FIG. 3b illustrates a graph 350 that shows the heat generated by the heating block 202 in an embodiment. As shown in the graph 350, the heating block 202 may generate more heat toward the edges 214, 216 of the die 206 than in the middle. The heat nozzle 204 may have a substantially uniform thermal conductivity, as shown by the graph 352 in FIG. 3c. Since the heating block 202 may generate less heat in the middle of the die 206, as shown by graph 350 in FIG. 3b, the temperature of the underfill 208 may be substantially uniform from the left die edge 214 to the right die edge 216 as shown in graph 354 in FIG. 3d. In other embodiments, the temperature of the solder bumps 210 (or other connectors) and the underfill 208 may not be substantially uniform as shown in graph 354, but may vary somewhat between the left die edge 214 and the right die edge 216. However, in an embodiment where the heating block 202 generates less heat in the middle of the die 206 as shown in graph 350 of FIG. 3b, this variation may be less than in prior art systems, such as shown in FIG. 1d. Generating less heat in the middle of the die 206 may result in the maximum underfill 208 temperature being low enough to substantially prevent formation of underfill voids.

Figure 3E:
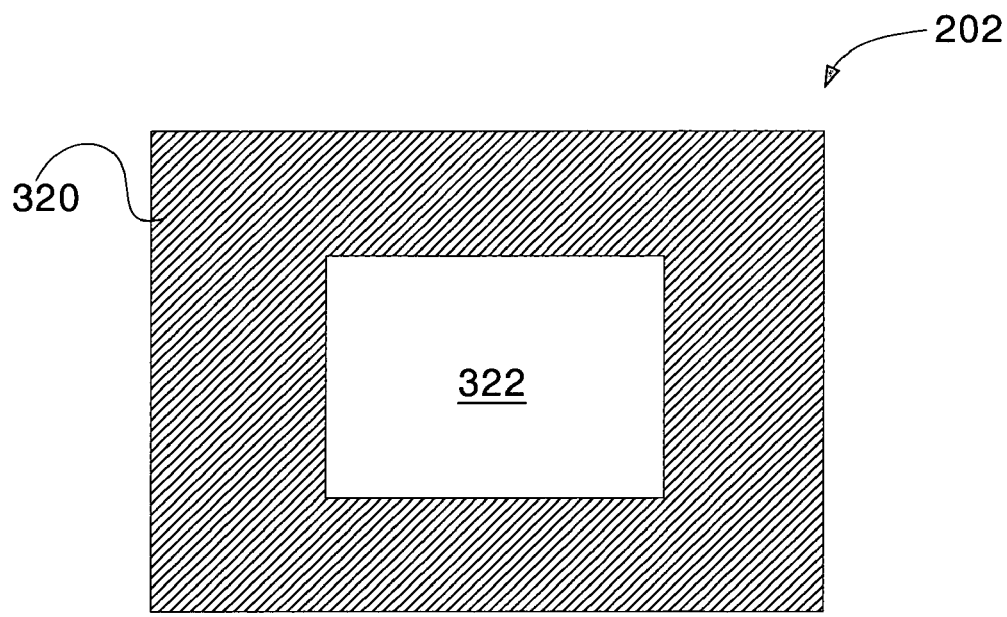
FIG. 3e is a cross sectional top view of a heating block that generates uneven heat according to one embodiment of the present invention.

FIG. 3e is a cross sectional top view of a heating block 202 that generates uneven heat according to one embodiment of the present invention. In an embodiment, the heating block 202 may include a middle section 322 and a peripheral section 320. The heating block 202 may generate more heat in the peripheral section 320 than in the middle section 322. The die 206 may be positioned so that the middle section 322 is positioned over the middle of the die 206. This may result in the heat generation graph 350 as shown in FIG. 3b, and result in a more even solder bump 210 (or other connector) and underfill 208 temperature, as shown in the graph 354 of FIG. 3d. The graph 354 indicates that the temperature of the solder bumps 210 (or other connectors) and the underfill 208 may be substantially uniform from the left die edge 214 to the right die edge 216 in an embodiment. In other embodiments, the temperature of the solder bumps 210 (or other connectors) and the underfill 208 may not be substantially uniform as shown in graph 354, but may vary somewhat between the left die edge 214 and the right die edge 216. However, this variation may be less than in prior art systems, such as shown in FIG. 1d. While the illustrated embodiment includes a sharp boundary between the middle section 322 and the peripheral section 320, in other embodiments there may be a gradual transition rather than a boundary. There may be progressively less heat generated at points closer to the middle of the heating block 202.

Figure 3F:
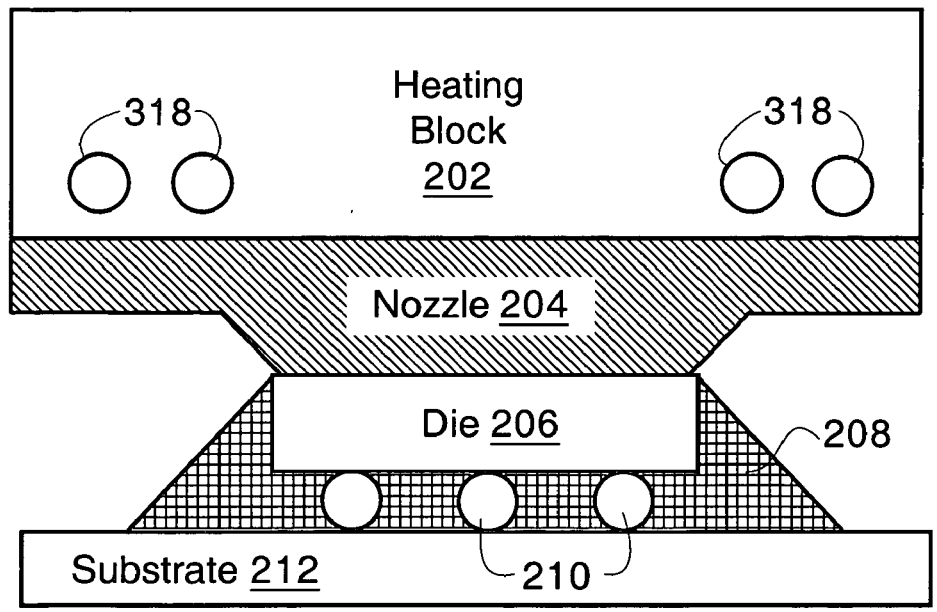
FIG. 3f is a cross sectional side view of one embodiment of a heating assembly that may provide more heat to the edges of a die than to the center of a die.

FIG. 3f is a cross sectional side view of one embodiment of a heating assembly 300 that may provide more heat to the edges of a die 206 than to the center of a die 206. In the embodiment illustrated in FIG. 3f, at least some heat that is generated by the heating block 202 is generated by heating elements 318, which may comprise conductive or semi-conductive elements wherein heat is generated by the resistance of the heating element 318 as a current passes through it, within a matrix material of the heating block 202. In an embodiment, there are more heating elements 318 per unit volume in the peripheral section 320 of the heating block 202 than in the middle section 322 of the heating block 202. Since there are more heating elements 318 in the peripheral section 320, the heating block 202 produces more heat in the peripheral section 320 than in the middle section 322.

FIG. 4a is a cross sectional side view of another embodiment of a heating assembly 400 that may provide more heat to the edges of a die 206 than to the center of a die 206. The heating assembly 400 may be similar in most respects to the heating assembly 300 described above, and may include a heating block 402, a heat nozzle 404, a die 206, a substrate 212, solder bumps 210 or other connectors, and underfill material 208. The heating block 402 may generate heat in a uniform manner, or in a non-uniform manner as described with respect to FIG. 3a. The shape, size, and material of the heat nozzle 404 may vary. In an embodiment, the heat nozzle 404 may comprise a thermally conductive material such as silicon nitride, aluminum nitride, copper carbide, tungsten carbide, steel, or another material.

In the embodiment illustrated in FIG. 4a, the heat nozzle 404 may have a non-uniform thermal conductivity. FIG. 4b illustrates a graph 450 that shows the heat generated by the heating block 402 in an embodiment. As shown in the graph 450, the heating block 402 may generate heat in a substantially uniform manner. However, the heat nozzle 404 may have a non-uniform thermal conductivity, as shown by the graph 452 in FIG. 4c. As shown by the graph 452 of FIG. 4c, the heat nozzle 404 may have a higher thermal conductivity toward the edges 214, 216 of the die 206, and a lower thermal conductivity toward the center of the die 206. Less heat will be transmitted by the center of the heat nozzle 404 than the periphery. Such differences in thermal conductivity may mean that the temperature of the solder bumps 210 (or other connectors) and the underfill 208 may be substantially uniform from the left die edge 214 to the right die edge 216 as shown in graph 454 in FIG. 4d; more heat is transmitted to the die 206 edges 214, 216 than to the die middle. In other embodiments, the temperature of the solder bumps 210 (or other connectors) and the underfill 208 may not be substantially uniform as shown in graph 454, but may vary somewhat between the left die edge 214 and the right die edge 216. However, in an embodiment where the heat nozzle 404 has a lower thermal conductivity in the middle, and therefore transmits less heat to the middle of the die 206, this variation may be less than in prior art systems, such as shown in FIG. 1d. Transmitting less heat to the middle of the die 206 may result in the maximum underfill 208 temperature being low enough to substantially prevent formation of underfill voids.

Figure 4E:
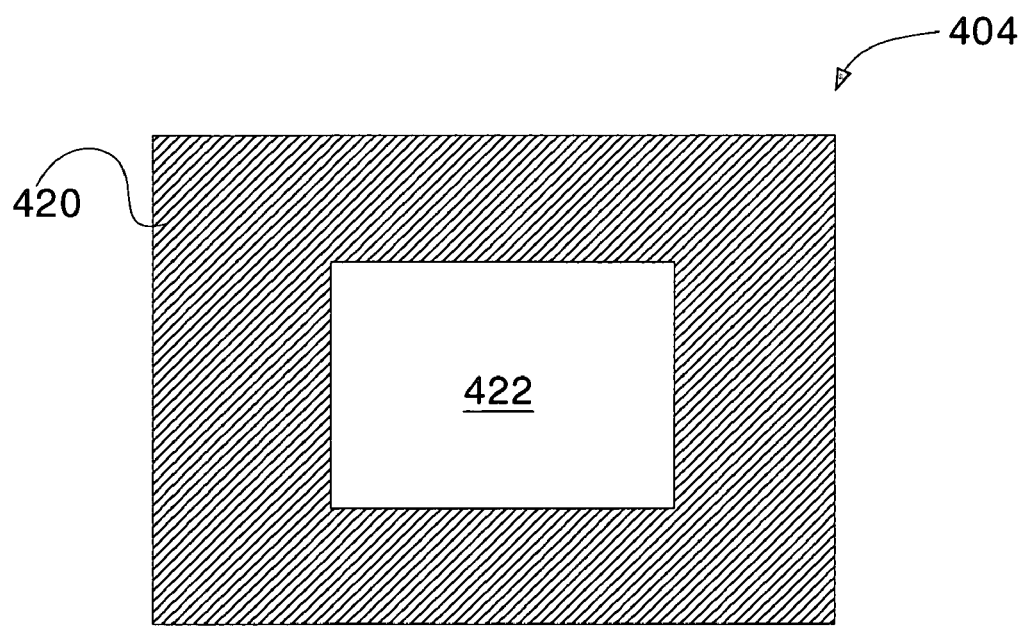
FIG. 4e is a cross sectional top view of a heat nozzle that has a varying thermal conductivity according to one embodiment of the present invention.

FIG. 4e is a cross sectional top view of a heat nozzle 404 that has a varying thermal conductivity according to one embodiment of the present invention. In an embodiment, the heat nozzle 404 may include a middle section 422 and a peripheral section 420. The heat nozzle 404 may have a higher thermal conductivity in the peripheral section 420 than in the middle section 422. The die 206 may be positioned so that the middle section 422 is positioned over the middle of the die 206. This may result in less heat being transmitted to the middle of the die 206, and result in a more even underfill temperature, as shown in the graph 454 of FIG. 4d. While the illustrated embodiment includes a sharp boundary between the middle section 422 and the peripheral section 420, in other embodiments there may be a gradual transition rather than a boundary. There may be a progressively lower thermal conductivity at points closer to the middle of the heat nozzle 404.

Figure 4F:
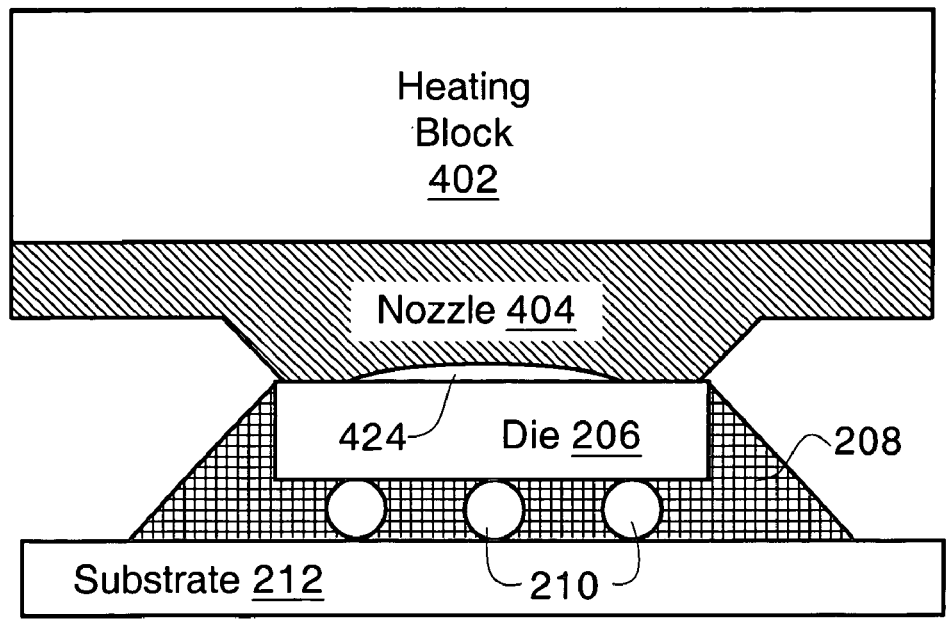
FIG. 4f is a cross sectional side view of one embodiment of a heating assembly that may provide more heat to the edges of a die than to the center of a die.

FIG. 4f is a cross sectional side view of one embodiment of a heating assembly 400 that may provide more heat to the edges of a die 206 than to the center of a die 206. In the embodiment illustrated in FIG. 4f, there may be a cavity 424 in the middle section of the heat nozzle 404. Such a cavity 424 means that the middle of the heat nozzle 404 is not in direct contact with the die 206 surface, creating an air gap that reduces the conduction of heat from the heat nozzle 404 to the die 206. In an embodiment, this cavity 424 may be a portion of a spherical shape. The maximum distance from the die to the surface of the heat nozzle 404, at the center of the spherical cavity 424, may be in a range from about several microns to about 100 microns. The cavity may extend to about two-thirds of the surface of the heat nozzle 404 in an embodiment. Since the presence of the cavity 424 reduces conduction of heat to the center of the die 206, the heat nozzle 404 transmits more heat in the peripheral section 420 than in the middle section 422. This may result in a more uniform temperature in the solder bump 210 (or other connector) and the underfill material 208, as illustrated in FIGS. 2, 3d, and 4d. In other embodiments, the peripheral section 420 of the heat nozzle 404 may comprise different materials than the middle section 422. For example, different materials in the peripheral section 420 and the middle section 422 may be deposited, laminated, or sintered together to form the heat nozzle 404 with varying thermal conductivities.

In other embodiments, various combinations of heating blocks 202 that produce different amounts of heat in different areas and heat nozzles 404 that have non-uniform thermal conductivities may be used in a heating assembly. These different combinations can be used to ensure a more uniform temperature in the solder bumps 210 (or other connectors) and the underfill material 208, as illustrated in FIGS. 2, 3d, and 4d.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

I claim:

1. A method, comprising:
   positioning a die with a perimeter and a center adjacent to a connection material that is adjacent to a substrate;
   applying heat to the die, wherein more heat is applied to the perimeter of the die than to the center of the die, and wherein a heat nozzle applies the heat; and
   wherein the heat nozzle comprises a peripheral section that comprises a first material with a first thermal conductivity, and a middle section that comprises a second material with a second thermal conductivity lower than the first thermal conductivity.

2. The method of claim 1, wherein more heat is applied to the perimeter of the die than to the center to raise the center of the die to a temperature in a range from about 200 degrees Celsius to about 340 degrees Celsius and to raise the perimeter of the die to a temperature in a range from about 200 degrees Celsius to about 340 degrees Celsius.

3. The method of claim 1, wherein more heat is applied to the perimeter of the die than to the center to make a temperature at the center of the die substantially equal to a temperature at the perimeter of the die.

4. The method of claim 1, wherein the connection material comprises epoxy.

5. A method, comprising:
   positioning a die with a perimeter and a center adjacent to a connection material that is adjacent to a substrate;
   applying heat to the die, wherein more heat is applied to the perimeter of the die than to the center of the die;
   wherein a heat nozzle applies the heat; and
   wherein the heat nozzle comprises a peripheral section that contacts the die and a middle section that does not contact the die.

6. The method of claim 5, wherein the middle section comprises a substantially spherical cavity.

7. The method of claim 1, wherein a heating block generates the heat.

8. A method, comprising:
   positioning a heat nozzle adjacent a surface of a die;
   heating the heat nozzle;
   transferring heat from the heat nozzle to the die, wherein more heat per unit area is transferred to an edge portion of the die than to a middle portion of the die;
   wherein heating the heat nozzle comprises transferring more heat per unit area from a heating block to an edge portion of the heat nozzle than to a middle portion of the heat nozzle; and
   wherein the heat nozzle comprises a peripheral section that comprises a first material with a first thermal conductivity, and a middle section that comprises a second material with a second thermal conductivity lower than the first thermal conductivity.

9. A method, comprising:
   positioning a heat nozzle adjacent a surface of a die;
   heating the heat nozzle;
   transferring heat from the heat nozzle to the die, wherein more heat per unit is transferred to an edge portion of the die than to a middle portion of the die;
   wherein heating the heat nozzle comprises transferring substantially the same amount of heat per unit area from a heating block to an edge portion of the heat nozzle as to a middle portion of the heat nozzle; and
   wherein the heat nozzle comprises a peripheral section that contacts the die and a middle section that does not contact the die.

10. A device, comprising;
a heater having a heating block portion and a heat nozzle portion;
a positioner, to position a die adjacent to the heater;
wherein the heater is adapted to apply to a substantially planar surface more heat at a peripheral portion of the heat nozzle than at a middle portion of the heat nozzle; and
wherein the heat nozzle portion comprises a peripheral section that comprises a first material with a first thermal conductivity, and a middle section that comprises a second material with a second thermal conductivity lower than the first thermal conductivity.

11. A device, comprising:
a heater having a heating block portion and a heat nozzle portion;
a positioner, to position a die adjacent to the heater;
wherein the heater is adapted to apply to a substantially planar surface more heat at a peripheral portion of the heat nozzle than at a middle portion of the heat nozzle; and
wherein the heat nozzle portion comprises a peripheral section to contact the substantially planar surface and a middle section that is adapted to not contact the substantially planar surface.

12. The device of claim 11, wherein the middle section comprises a substantially spherical cavity.

13. The device of claim 10, wherein the heating block portion generates the heat.

\* \* \* \* \*